United States Patent
Suzuki

(10) Patent No.: US 7,990,233 B2
(45) Date of Patent: Aug. 2, 2011

(54) MEMS RESONATOR INCLUDING MAIN AND SUB MOVABLE BEAMS, AND EXCITING ELECTRODES EXCITED BY ALTERNATING-CURRENT SIGNAL

(75) Inventor: Kenichiro Suzuki, Otsu (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 315 days.

(21) Appl. No.: 12/265,141

(22) Filed: Nov. 5, 2008

(65) Prior Publication Data

US 2010/0327992 A1    Dec. 30, 2010

(30) Foreign Application Priority Data

May 1, 2008    (JP) .................................. 2008-119796

(51) Int. Cl.
*H03H 9/24* (2006.01)
*H03H 9/125* (2006.01)
*H03B 5/30* (2006.01)
*H03H 9/46* (2006.01)

(52) U.S. Cl. ........ 333/186; 333/188; 310/309; 331/156; 331/177 R

(58) Field of Classification Search .................. 333/186, 333/188; 310/309; 331/154, 156, 177 R
See application file for complete search history.

(56) References Cited

U.S. PATENT DOCUMENTS

| | | | |
|---|---|---|---|
| 5,914,553 A * | 6/1999 | Adams et al. ................. | 310/309 |
| 6,490,147 B2 | 12/2002 | Yoon et al. | |
| 7,741,932 B2 * | 6/2010 | Nakamura et al. ............ | 333/186 |
| 2004/0061564 A1 * | 4/2004 | Photiadis et al. ............. | 331/156 |
| 2008/0047346 A1 * | 2/2008 | Vyas et al. ....................... | 73/580 |
| 2008/0204153 A1 * | 8/2008 | Yoshida et al. ................ | 331/66 |
| 2009/0294638 A1 * | 12/2009 | Mohanty et al. .............. | 250/234 |

FOREIGN PATENT DOCUMENTS

| | | |
|---|---|---|
| EP | 1 803 684 | 7/2007 |
| JP | 2006-005731 | 1/2006 |
| JP | 2006-524020 | 10/2006 |
| JP | 2007-184931 | 7/2007 |

(Continued)

OTHER PUBLICATIONS

Makita et al.; "Silicon Fishbone-Shaped Resonant-Frequency-Tunable MEMS Resonator"; Microprocesses and Nanotechnology, 2007 Digest of Papers, pp. 500-501; Kyoto, Nov. 5-8, 2007.*

(Continued)

*Primary Examiner* — Barbara Summons
(74) *Attorney, Agent, or Firm* — Wenderoth, Lind & Ponack, L.L.P.

(57) ABSTRACT

A MEMS resonator includes a main movable beam, at least one sub movable beam, and at least one exciting electrode. The main movable beam is electrically insulated from a substrate and fixed to at least one fixed end, the sub movable beam is formed to extend from the main movable beam, and the exciting electrode is provided to be close to the sub movable beam. The sub movable beam is excited by an electrostatic force to oscillate by exciting the exciting electrode using an alternating-current signal, such that the MEMS resonator resonates with at least one of a fundamental resonant frequency and harmonic frequencies thereof. The resonant frequency is changed by changing at least one of number of the at least one exciting electrode and a position of the exciting electrode relative to the sub movable beam.

20 Claims, 14 Drawing Sheets

FOREIGN PATENT DOCUMENTS

WO 2004/095696 11/2004
WO WO 2006/013741 * 2/2006

OTHER PUBLICATIONS

Abstract and publication information from the IEEExplore website for the article "Silicon Fishbone-Shaped Resonant-Frequency-Tunable MEMS Resonator", Kyoto, Nov. 5-8, 2007.*

Kun Wang et al., "VHF Free-Free Beam High-Q Micromechanical Resonators", Journal of Microelectromechanical Systems, vol. 9, No. 3, pp. 347-360, Sep. 2000.

Wan-Thai Hsu, "Vibrating RF MEMS for Timing and Frequency References", Digests of IEEE MTT-S 2006 International Microwave Symposium, pp. 672-675, 2006.

* cited by examiner

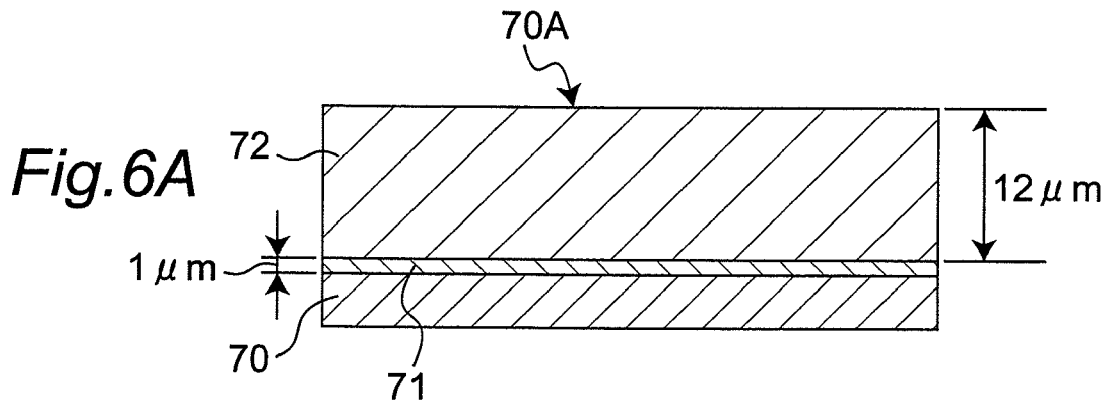
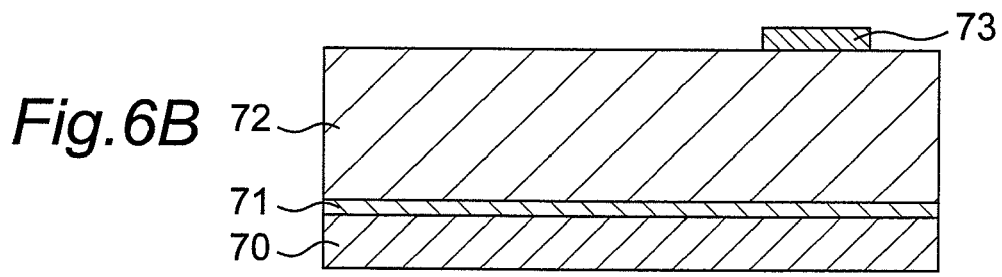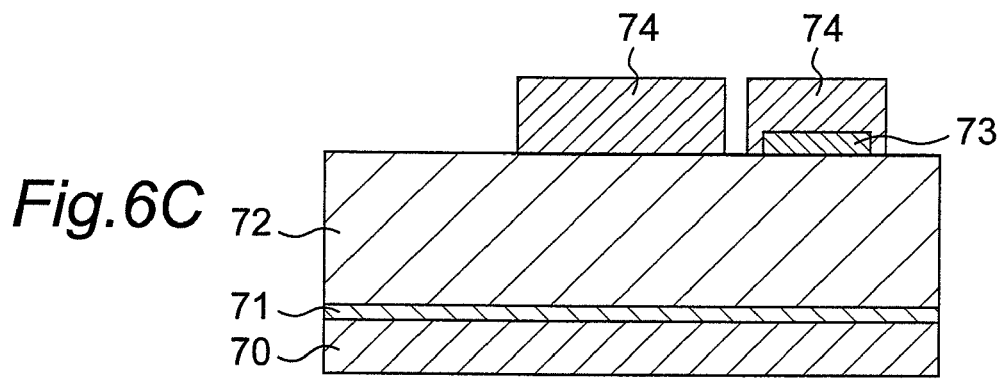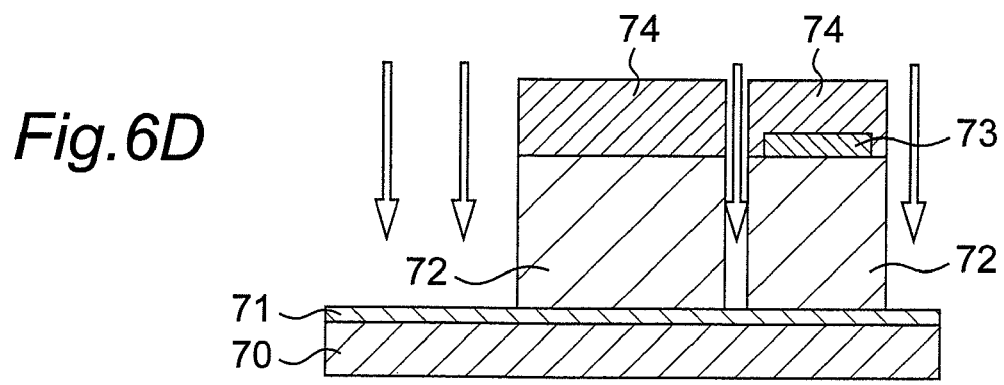

MEMS RESONATOR INCLUDING MAIN AND SUB MOVABLE BEAMS, AND EXCITING ELECTRODES EXCITED BY ALTERNATING-CURRENT SIGNAL

BACKGROUND OF THE INVENTION

1. Field of the Invention

The present invention relates to a MEMS (Micro-Electro-Mechanical System) resonator formed using MEMS technique capable of realizing an ultra-fine mechanical mechanism using a fine processing technique for semiconductors, and also, the present invention relates to a MEMS oscillation circuit using the MEMS resonator, and a MEMS device using the MEMS resonator.

2. Description of the Related Art

Recently, demand for RF technology has increasingly risen. Various requirements are made of RF devices to follow functional diversification and a sharp increase in the number of users of the RF devices. It is particularly desired to provide a multi-clock function for directly generating a plurality of frequencies in addition to downsizing and low cost to an oscillator because of the need to make effective use of limited RF frequencies. In such social background, attention has been paid to the MEMS technique for application of portable wireless terminal devices. This is because a MEMS device is characterized by low power consumption, high density packaging, broadband characteristics, and the like.

A MEMS resonator has been actively studied mainly in the U.S.A. since the latter half of 1990s. At present, a few companies have now been able to provide MEMS resonator samples. These products mainly replace crystal oscillators and can characteristically downsize devices. On the other hand, possibility of the MEMS resonator is not limited to simple replacement of the crystal oscillator. For example, the multi-clock function of the MEMS resonator is expected to create a new market differently from overtone technique related to the crystal oscillators.

Documents related to the present invention are as follows:
Patent Document 1: Specification of U.S. Pat. No. 6,490,147;
Patent Document 2: Japanese patent laid-open publication No. JP-2007-184931-A1;
Non-Patent Document 1: Wan-Thai Hsu, "Vibrating RF MEMS for Timing and Frequency References", Digests of IEEE MTT-S 2006 International Microwave Symposium, pp. 672-675, 2006; and
Non-Patent Document 2: Kun Wang et al., "VHF Free-Free Beam High-Q Micromechanical Resonator", Journal of Microelectromechanical Systems, Vol. 9, No. 3, pp. 347-360, September 2000.

For example, Non-Patent Document 1 describes outline of a vibrating RF-MEMS oscillator. In this case, types of the RF-MEMS oscillator are classified into a beam type, a disk type, a ring type, and an FBAR (Film Bulk Acoustic Resonators) type. Among these types, a "free-free beam MEMS resonator" disclosed in Non-Patent Document 2 (which resonator is also described in, for example, Patent Documents 1 and 2) will be now described with reference to FIG. 18.

As shown in FIG. 18, the "free-free beam MEMS resonator" according to a prior art is configured as follows. A central beam 100 (called "free-free resonating beam") supported by a ground surface and four springs 101 fixed to anchors 102, respectively, on a detection electrode 90 is provided in a lower portion of the center of the resonator. The central beam 100 is bent and oscillates by receiving an electrostatic force from an electrode 91 excited by an alternating-current (AC) signal Vi. In FIG. 18, reference symbol 103 denotes a concave portion, reference symbol 104 denotes a node point in a flexural mode, and an oscillation signal output circuit 110 is connected to the detection electrode 90. A basic oscillation mode of the resonator is a mode in which the central beam 100 flexes vertically. Parts having high amplitudes (oscillation centers) are located at three portions, i.e., the center and both ends of the resonator, respectively. In view of waveform, this oscillation mode corresponds to a wave having a half-wavelength. Further, the Non-Patent Document 1 reports that devices of various dimensions are designed and that a device having a resonant frequency of 30 MHz to 90 MHz is produced as a prototype.

However, the "free-free beam MEMS resonator" according to the prior art has the following problems. A resonant frequency of the resonator is decided by dimensions of a device. For example, when a length of the resonating beam is set to 16 μm and 14 μm, corresponding resonance frequencies are 50 MHz and 70 MHz, respectively. In this way, according to the prior art, only one resonant frequency can be pulled out from one device. The reason is as follows. Generally speaking, a resonator can excite an oscillation of a higher harmonic wave that is an integer multiple of a fundamental wave. However, since the support springs supporting the oscillating beam function to suppress harmonics, the frequency pulled out from the resonator is limited to a constant frequency. As can be seen, a structure of the resonator according to this prior art is disadvantageously incapable of changing frequencies.

Moreover, the electrostatic force generated from the electrode provided to be opposed to the oscillating beam directly acts on the oscillating beam. Therefore, as the frequency is higher, the oscillating beam is smaller in dimensions and an area of the oscillating beam opposed to the exciting electrode is made smaller. As a result, it is disadvantageously difficult for the electrostatic force to effectively act on the oscillating beam and driving voltage disadvantageously increases.

On the other hand, in a manner different from the structure according to the prior art in which the four support springs 101 are provided in portions that are nodes of traverse vibrations corresponding to modified directions of the oscillating beam, respectively, there has been known another structure of fixing both ends of an oscillating beam according to another prior art. In this case, it is possible to use a harmonic wave in addition to the fundamental wave. However, the structure according to another prior art has a problem that the harmonic wave is always low in amplitude than a lower-order harmonic wave. Accordingly, although a plurality of resonance frequencies can be used by use of the overtone technique, strains occur to an oscillation waveform as a higher-order resonant frequency is used. Furthermore, the structure according to another prior art also has a problem of need of a filter circuit suppressing lower-order frequency.

SUMMARY OF THE INVENTION

It is an object of the present invention to provide a resonator capable of solving the above-stated problems, resonating with at least one frequency of a fundamental wave and harmonic waves without using an overtone technique, changing resonance frequencies, and being excited at lower driving voltage than that according to the prior arts, and to provide an oscillation circuit using the resonator and a MEMS device using the resonator.

In order to achieve the aforementioned objective, according to one aspect of the present invention, there is provided a MEMS resonator including a main movable beam, at least one sub movable beam, and at least one exciting electrode. The main movable beam is electrically insulated from a substrate, and is fixed to at least one fixed end. At least one sub movable beam is formed to extend from the main movable beam, and at least one exciting electrode is provided to be close to the sub movable beam. The sub movable beam is excited by an electrostatic force to oscillate by exciting the exciting electrode using an alternating-current signal, such that the MEMS resonator resonates with at least one of a fundamental resonant frequency and harmonic frequencies thereof.

In the above-mentioned MEMS resonator, the resonant frequency is changed by changing at least one of number of the at least one exciting electrode and a position of the exciting electrode relative to the sub movable beam.

In addition, in the above-mentioned MEMS resonator, the main movable beam is fixed to two fixed ends.

Further, in the above-mentioned MEMS resonator, the substrate is one of a dielectric substrate and a semiconductor substrate, and the main movable beam and the sub movable beam are formed of one of a conductive material and a semiconductor material.

According to another aspect of the present invention, there is provided a MEMS oscillation circuit including the MEMS resonator, and the MEMS oscillation circuit oscillates with an identical frequency to the resonant frequency of the MEMS resonator.

According to a further aspect of the present invention, there is provided a MEMS device including the MEMS resonator, and the MEMS device utilizes a resonant state of the MEMS resonator.

Therefore, the MEMS resonator according to the present invention can resonate with at least one frequency of the fundamental wave and the harmonic waves without using the overtone technique, with changing resonance frequencies, and can be excited at a lower driving voltage than that according to the prior arts. Moreover, a very small frequency-variable oscillator using the MEMS resonator and a MEMS device using a resonant state of the MEMS resonator can be constituted.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 6A is a longitudinal sectional view showing a first step of manufacturing the MEMS resonator shown in FIG. 1;

FIG. 6B is a longitudinal sectional view showing a second step thereof;

FIG. 6C is a longitudinal sectional view showing a third step thereof;

FIG. 6D is a longitudinal sectional view showing a fourth step thereof;

DETAILED DESCRIPTION OF THE INVENTION

Preferred embodiments of the present invention will be described hereinafter with reference to the drawings. In the preferred embodiments, similar components are denoted by same reference symbols, respectively.

Figure 1:
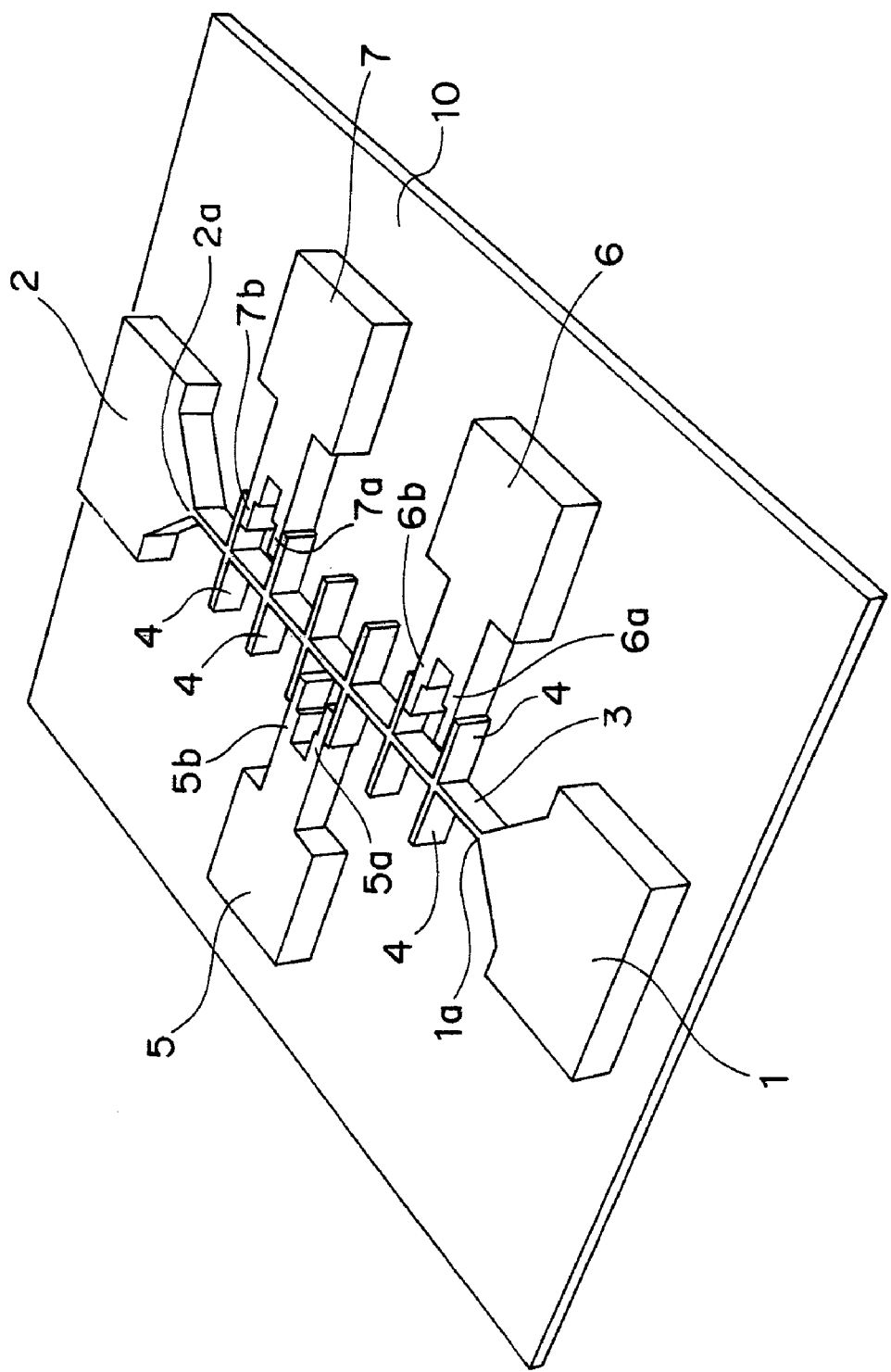
FIG. 1 is a perspective view showing a structure of a MEMS resonator according to one preferred embodiment of the present invention.
Figure 2:
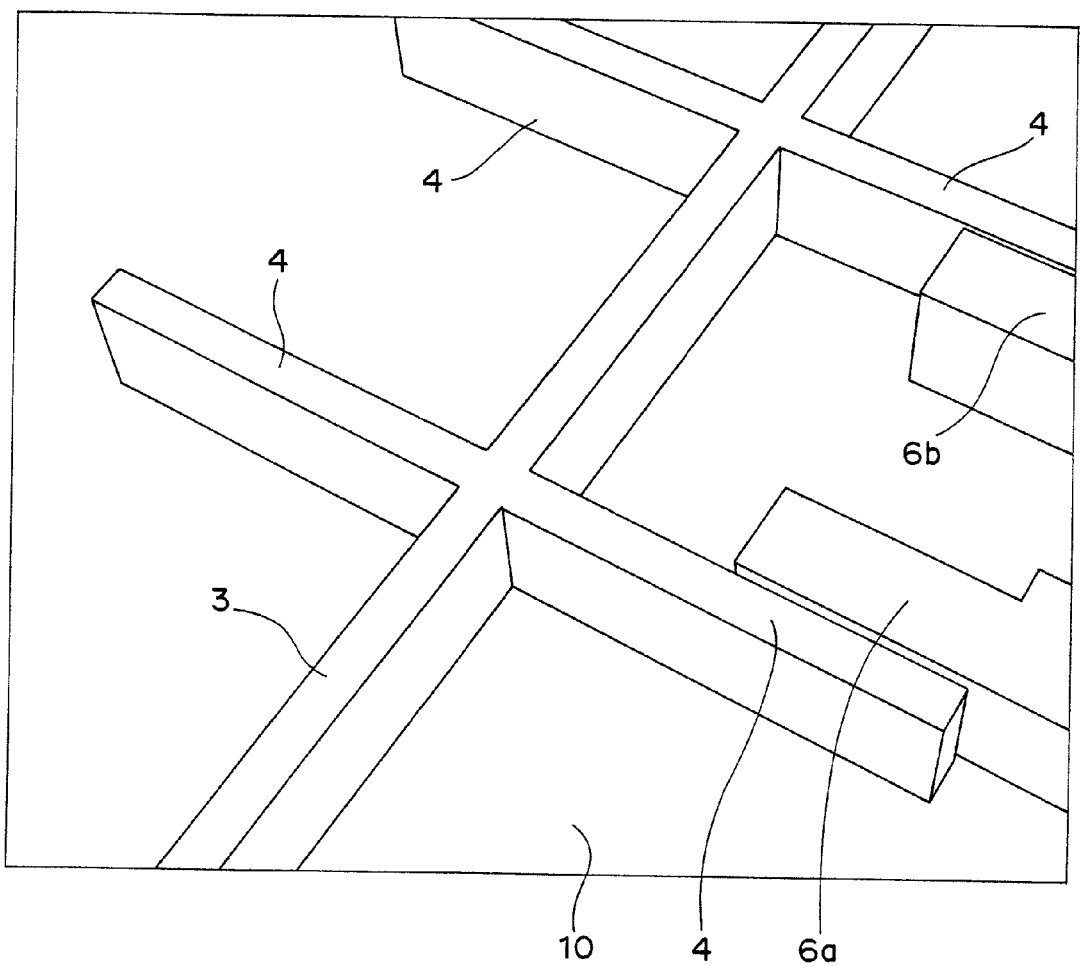
FIG. 2 is an enlarged view of neighborhoods of a main movable beam 3 shown in FIG. 1.
Figure 3:
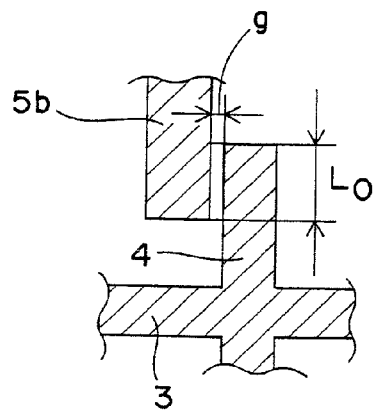
FIG. 3 is a plan view showing a positional relationship between one of sub movable beams 4 shown in FIG. 1 and an exciting arm 5b of an exciting electrode 5 shown in FIG. 1.
Figure 4:
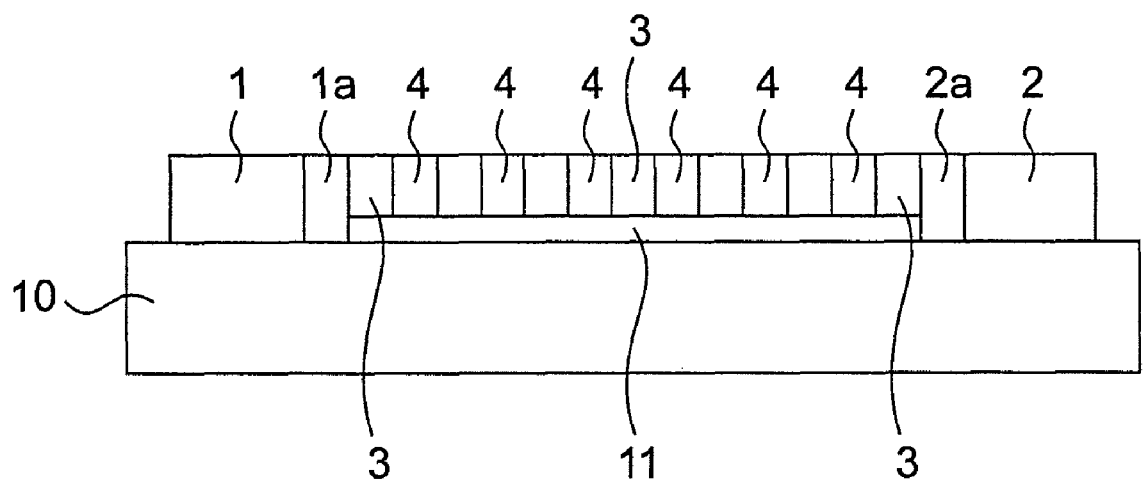
FIG. 4 is a side view of the MEMS resonator shown in FIG. 1.

FIG. 1 is a perspective view showing a structure of a MEMS device according to one embodiment of the present invention. FIG. 2 is an enlarged view showing neighborhoods of a main movable beam 3 shown in FIG. 1. FIG. 3 is a plan view showing a positional relationship between one of sub movable beams 4 shown in FIG. 1 and an exciting arm 5*b* of an exciting electrode 5 shown in FIG. 1. FIG. 4 is a side view of the MEMS resonator shown in FIG. 1.

Referring to FIGS. 1 and 2, anchor units 1 and 2 serving as fixed ends of the MEMS resonator and made of, for example, a mono-crystalline silicon are formed on a glass substrate 10 to be away from each other by a predetermined length and to be electrically insulated from the glass substrate 10. Each of the anchor units 1 and 2 is formed into a flat shape that is a combination of, for example, a rectangle and a triangle. The anchor units 1 and 2 are arranged so that vertexes 1*a* and 2*a* thereof are opposed to each other. The main movable beam 3 is formed between the vertexes 1*a* and 2*a*, where the main movable beam 3 extends from the anchor units 1 and 2, connects the anchor units 1 and 2 to each other, has a predetermined cavity 11 (See FIG. 4) from the glass substrate 10, is formed to be able to oscillate, and is made of mono-crystalline silicon. In addition, a plurality of sub movable beams 4 is formed between the vertexes 1*a* and 2*a*, where each of the sub movable beams 4 extends to protrude from both side surfaces of the main movable beam 3 in a direction substantially orthogonal to the main movable beam 3 and is made of mono-crystalline silicon. In the preferred embodiment shown in FIG. 1, six sub movable beams 4 are formed to penetrate through the main movable beam 3 in a direction orthogonal to a longitudinal direction of the main movable beam 3. As apparent from FIG. 1, a combinational shape of the main movable beam 3 and the sub movable beams 4 is a so-called fishbone shape.

Furthermore, exciting electrodes 5, 6, and 7 are formed on the glass substrate 10 so that exciting arms 5*a* and 5*b*, 6*a* and 6*b*, and 7*a*, and 7*b* of the exciting electrodes 5, 6, and 7 are close to the different sub movable beams 4 and opposed to side surfaces of the different sub movable beams 4, respectively. For example, as shown in the enlarged view of FIG. 3, each of the sub movable beams 4 is arranged to have an overlapped length L0 so as to be overlapped with the exciting arm 5*b* of the exciting electrode 5 and to have a gap "g" between the sub movable beam 4 and the exciting arm 5*b*. Each of the sub movable beams 4 is arranged in an arrangement relationship similar to the above for the electrodes 6 and 7.

In the above-stated preferred embodiment, the glass substrate 10 is employed. However, the present invention is not limited to this, and another dielectric substrate or a semiconductor substrate such as a GaAs substrate may be employed. Moreover, in the above-stated preferred embodiment, excitation by the arms 5*a* and 5*b*, 6*a* and 6*b*, and 7*a* and 7*b* of the respective exciting electrodes 5, 6, and 7 is done from the side surfaces of the sub movable beams 4. However, the present invention is not limited to this, and the sub movable beams 4 may be away from the exciting arms 5*a* and 5*b*, 6*a* and 6*b*, and 7*a* and 7*b* each by the predetermined distance or gap "g" during excitation, and the excitation may be executed from the bottom surface or the top surface of each of the sub movable beams 4.

Moreover, the anchor units 1 and 2, the main movable beam 3, and the sub movable beams 4 are all formed of the mono-crystalline silicon (Si). However, the present invention is not limited to this, and then, the anchor units 1 and 2, the main movable beam 3, and the sub movable beams 4 may be formed of a conductive material such as metal, e.g., Au, Ag, Cu or Al or a semiconductor material such as polysilicon, amorphous silicon, GaAs, GaAsP, GaN or SiC. Alternatively, each of the anchor units 1 and 2, the main movable beam 3, and the sub movable beams 4 may be formed by plating a surface of a dielectric material with a metal material or the like. Further, each of the sub movable beams 4 may be formed to extend from the main movable beam 3 at least at a predetermined angle.

Figure 5:
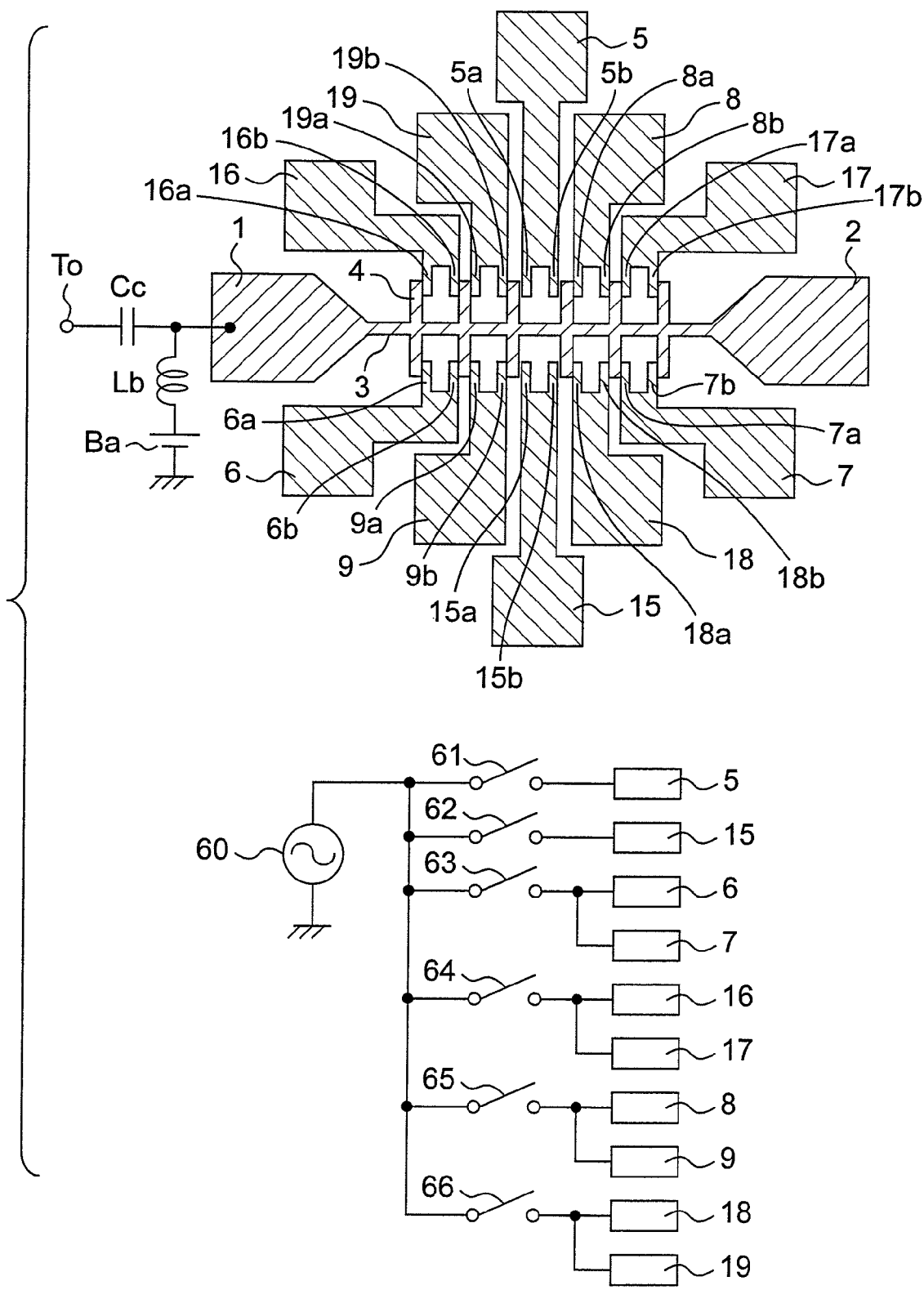
FIG. 5 is a circuit diagram showing a plane structure of a MEMS oscillator using the MEMS resonator shown in FIG. 1 and an electric circuit of the MEMS oscillator.

FIG. 5 is a circuit diagram showing a plane structure of a MEMS oscillator using the MEMS resonator shown in FIG. 1 and an electric circuit thereof. Referring to FIG. 5, exciting electrodes 5 and 15 are formed on both sides of the main movable beam 3, respectively, so that exciting arms 5*a*, 5*b*, 15*a* and 15*b* of exciting electrodes 5 and 15 are close and opposed to each different sub movable beam 4 located in the central portion of the main movable beam 3, and so that the exciting arms 5*a* and 5*b* and 15*a* and 15*b* are inserted between the two adjacent sub movable beams 4. Moreover, on right sides of exciting electrodes 5 and 15 of FIG. 5 (in a direction toward the anchor unit 2), exciting electrodes 8 and 18 are formed on the both sides of the main movable beam 3, respectively, so that exciting arms 8*a*, 8*b*, 18*a* and 18*b* of the exciting electrodes 8 and 18 are arranged to be close and opposed to each different sub movable beam 4. Moreover, on the right sides of exciting electrodes 8 and 18 of FIG. 5 (in the direction toward the anchor unit 2), exciting electrodes 7 and 17 are formed on the both sides of the main movable beam 3, respectively, so that exciting arms 7*a*, 7*b*, 17*a* and 17*b* of the exciting electrodes 7 and 17 are arranged to be close and opposed to each different sub movable beam 4. On the other hand, on lest sides of exciting electrodes 5 and 15 of FIG. 5 (in a direction toward the anchor unit 1), exciting electrodes 9 and 19 are formed on the both sides of the main movable beam 3, respectively, so that exciting arms 9*a*, 9*b*, 19*a* and 19*b* of the exciting electrodes 9 and 19 are arranged to be close and opposed to each different sub movable beam 4. Further, on the left sides of exciting electrodes 9 and 19 of FIG. 5 (in the direction toward the anchor unit 1), exciting electrodes 6 and 16 are formed on the both sides of the movable main beam 3, respectively, so that exciting arms 6*a*, 6*b*, 16*a* and 16*b* of the exciting electrodes 6 and 16 are close and opposed to each different movable sub beam 4.

The anchor unit 1 is connected to an output terminal To via a coupling capacitor Cc, and a bias voltage source Ba is connected to the anchor unit 1 via a harmonic-stop inductor Lb. An exciting signal generator 60 has excitation frequencies of, for example, 1 kHz to 1 GHz, generates exciting signals to excite the respective exciting electrodes 5 to 9 and 15 to 19, and outputs the generated exciting signals to the exciting electrode 5 via a switch 61, to the exciting electrode 15 via a switch 62, to the exciting electrodes 6 and 7 via a switch 63, to the exciting electrodes 16 and 17 via a switch 64, to the exciting electrodes 8 and 9 via a switch 65, and to the exciting electrodes 18 and 19 via a switch 66.

In the electronic circuit of the MEMS oscillator configured as stated above, the predetermined exciting electrodes 5 to 9 and 15 to 19 can be excited by turning on the switches 61 to 66. The simulation results will be described later in detail.

FIGS. 6A to 6D and 7A to 7D are longitudinal sectional views showing steps of manufacturing the MEMS resonator shown in FIG. 1, respectively. Referring to FIGS. 6A to 6D and 7A to 7D, the steps of manufacturing the MEMS resonator shown in FIG. 1 will be described.

Figure 7A:
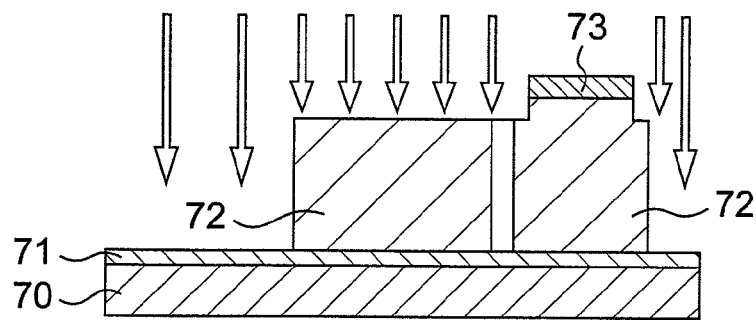
FIG. 7A is a longitudinal sectional view showing a fifth step of manufacturing the MEMS resonator shown in FIG. 1.

As shown in FIG. 6A, first of all, a silicon-on-insulator wafer (referred to as an SOI wafer hereinafter) 70A is prepared. In this case, the SOI wafer 70A is configured to form a Si active layer 72 above a silicon substrate 70 via a $SiO_2$ insulation layer 71 of an embedded layer. Next, as shown in FIG. 6B, a Cr layer 73 is formed on the SOI wafer 70A by patterning. As shown in FIG. 6C, a photo-resist layer 74 is formed on the Cr layer 73 by patterning. As shown in FIG. 6D, the Si active layer 72 is etched with a predetermined pattern using inductively coupled plasma reactive ion etching (ICP-RIE) method for providing a large depth. Thereafter, as shown in FIG. 7A, the photo-resist layer 74 is etched with a predetermined pattern using an ICP-RIE method providing a small depth.

Figure 7B:
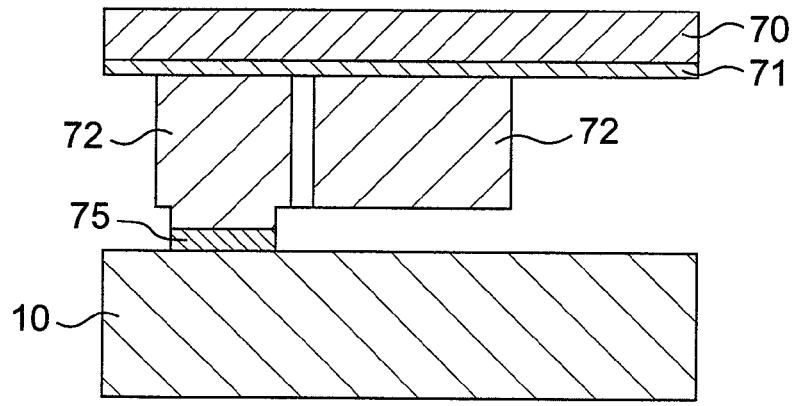
FIG. 7B is a longitudinal sectional view showing a sixth step thereof.
Figure 7C:
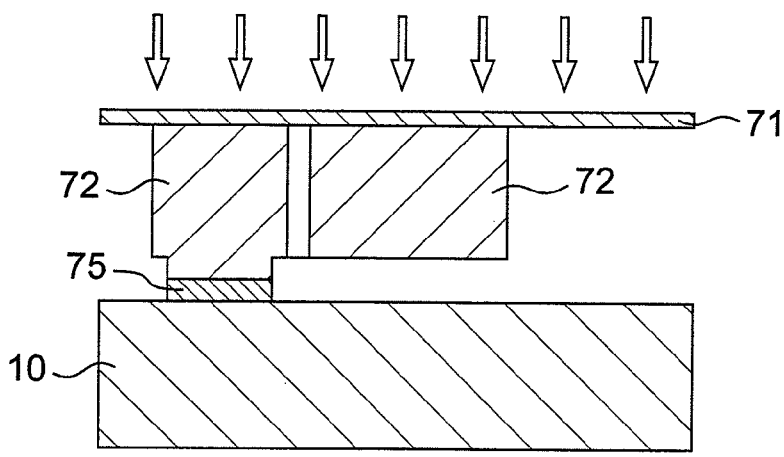
FIG. 7C is a longitudinal sectional view showing a seventh step thereof.
Figure 7D:
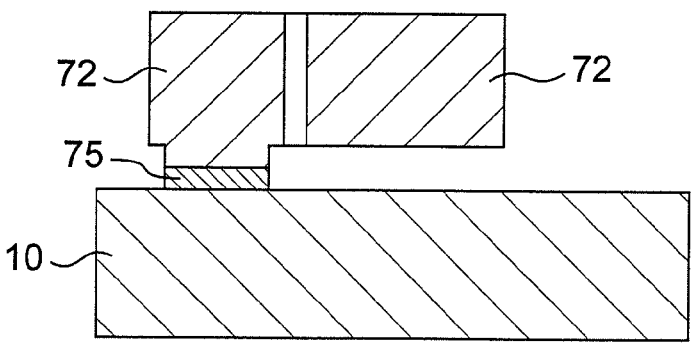
FIG. 7D is a longitudinal sectional view showing an eighth step thereof.

Next, as shown in FIG. 7B, the obtained device is turned upside down and the protruding active layer 72 is bonded on a glass substrate 10 by a predetermined adhesive. In FIG. 7B, reference symbol 75 denotes an adhesive layer. As shown in FIG. 7C, a layer of the silicon substrate 70 on the front top surface is etched by a predetermined etching method, and then, a device of the MEMS resonator can be obtained as shown in FIG. 7D.

In the above-stated preferred embodiment, the Si active layer 72 is bonded on the glass substrate 10 using the adhesive layer 75. However, the present invention is not limited to this, and the Si active layer 72 may be bonded by the following method. Referring to FIG. 7B, a silicon device (a formed device including the SOI wafer 70A) is turned upside down and the protruding Si active layer 72 is directly bonded onto the glass substrate 10 by an electrostatic bonding method. This can be realized by heating the silicon device and the glass substrate 10 to about 400° C. and applying a voltage of about 500 volts (V) to between the silicon device and the glass substrate 10 with the silicon device set as a positive electrode. This bonding method is effective for making the device stable for long time since the adhesive layer 75 is not used.

The operation performed by the MEMS resonator according to the present preferred embodiment will be next described with comparing the operation with operation performed by a MEMS resonator including only the main movable beam 3.

Figure 8A:
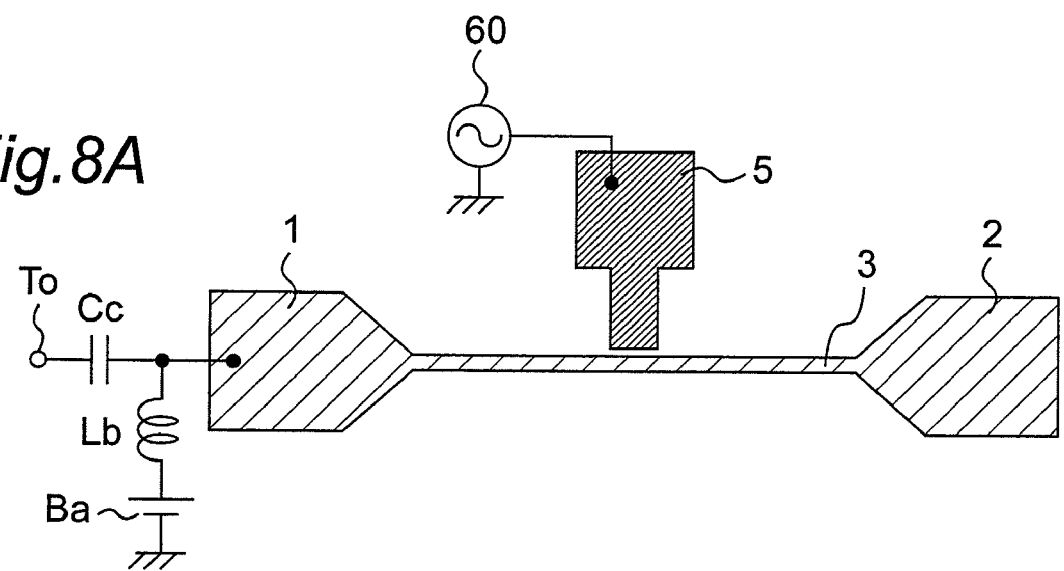
FIG. 8A is a plan view showing a structure of a MEMS resonator including only a main movable beam 3 according to a comparative example.
Figure 8B:
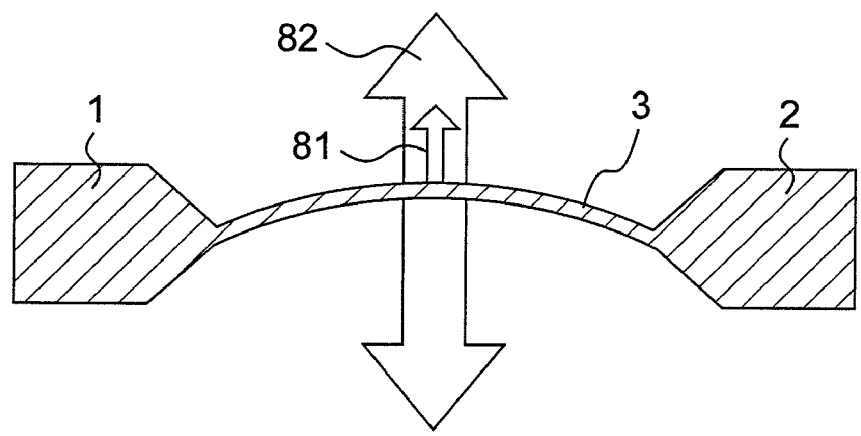
FIG. 8B is a plan view showing an oscillating state of the MEMS resonator shown in FIG. 8A.
Figure 9A:
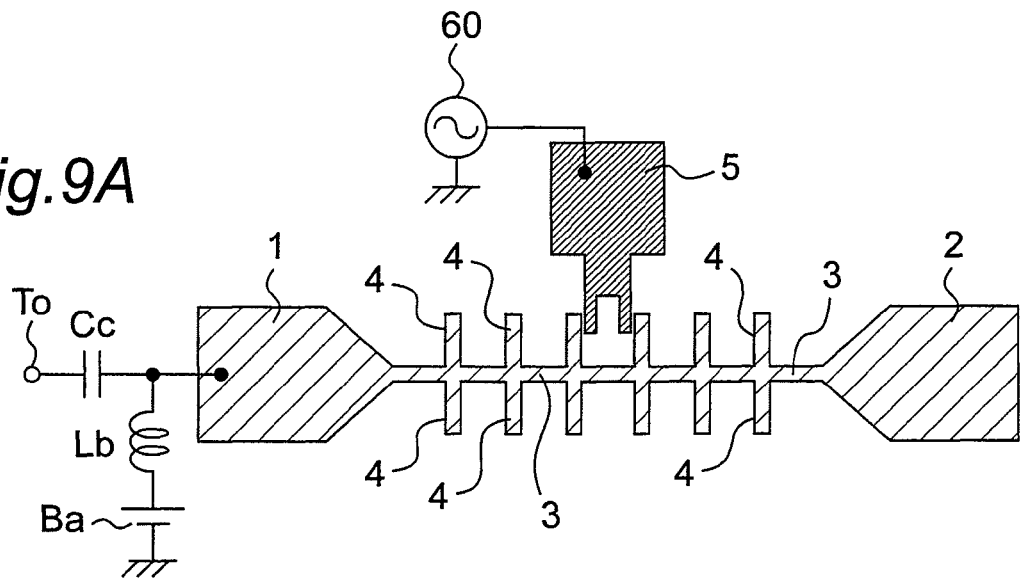
FIG. 9A is a plan view showing a structure of a MEMS resonator including one exciting electrode 5 according to the present preferred embodiment.
Figure 9B:
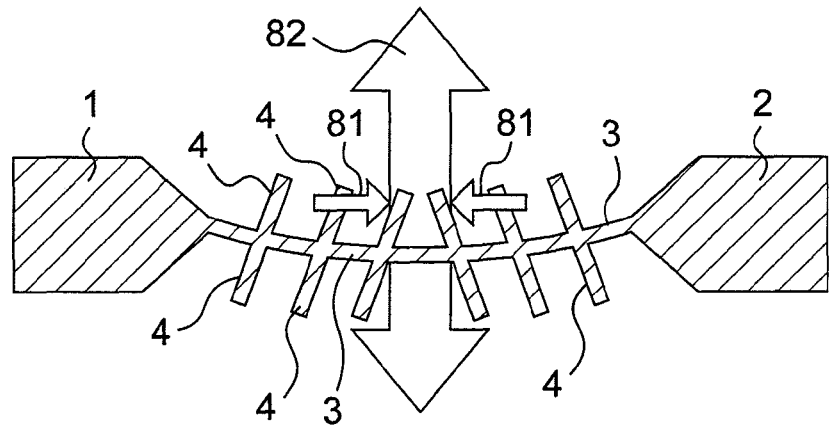
FIG. 9B is a plan view showing an oscillating state of the MEMS resonator shown in FIG. 9A.

FIG. 8A is a plan view showing a structure of a MEMS resonator including only a main movable beam 3 according to a comparative example. FIG. 8B is a plan view showing an oscillating state of the MEMS resonator shown in FIG. 8A. FIG. 9A is a plan view showing a structure of a MEMS resonator including one exciting electrode according to the present preferred embodiment. FIG. 9B is a plan view showing an oscillating state of the MEMS resonator shown in FIG. 9A. As shown in FIGS. 8A and 8B, when the main movable beam 3 is excited by an exciting electrode 5, an electrostatic force 81 is generated in a direction orthogonal to the main movable beam 3 in the MEMS resonator including only the main movable beam 3 according to the comparative example, and the MEMS resonator oscillates in directions indicated by an arrow 82. On the other hand, when the main movable beam 3 is excited by the exciting electrode 5, an electrostatic force 81 is generated in a direction almost orthogonal to the sub movable beams 4 in the MEMS resonator including the main movable beam 3 and the sub movable beams 4 according to the present preferred embodiment, and the MEMS resonator oscillates in directions indicated by an arrow 82.

Figure 10A:
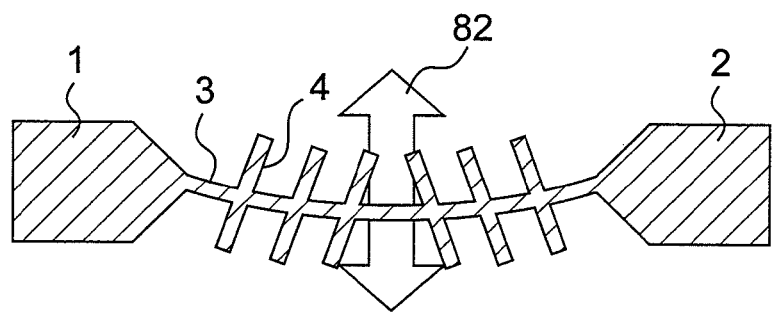
FIG. 10A is a plan view showing an oscillating state of the MEMS resonator in a fundamental resonant frequency mode according to the present preferred embodiment.

FIG. 10A is a plan view showing an oscillating state of the MEMS resonator in a fundamental resonant frequency mode according to the present preferred embodiment. This shows a case of turning on only the switch 61 shown in FIG. 5 to excite the main movable beam 3 only by the exciting electrode 5 located in the central portion. In this case, the MEMS resonator oscillates in a primary resonant frequency mode (fundamental resonant frequency mode).

Figure 10B:
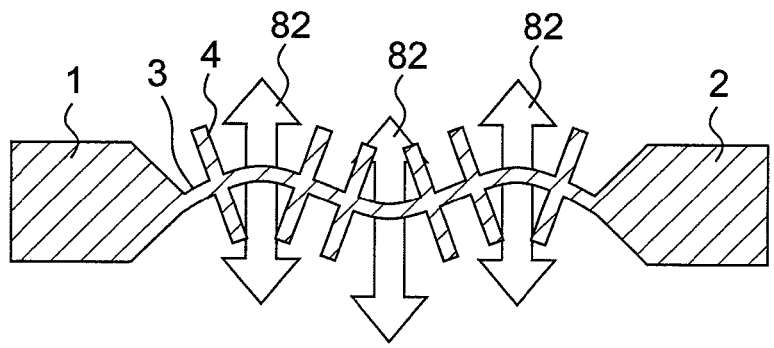
FIG. 10B is a plan view showing an oscillating state of the MEMS resonator in a ternary harmonic resonant frequency mode according to the present preferred embodiment.

FIG. 10B is a plan view showing an oscillating state of the MEMS resonator in a ternary harmonic resonant frequency mode according to the present preferred embodiment. This shows a case of turning on only the switch 63 of FIG. 5 to excite the main movable beam 3 using the two exciting electrodes 6 and 7 located to be away from each other by a predetermined distance and located on both sides of the main movable beam 3, respectively. In this case, the MEMS resonator oscillates in the ternary harmonic resonant frequency mode.

Figure 10C:
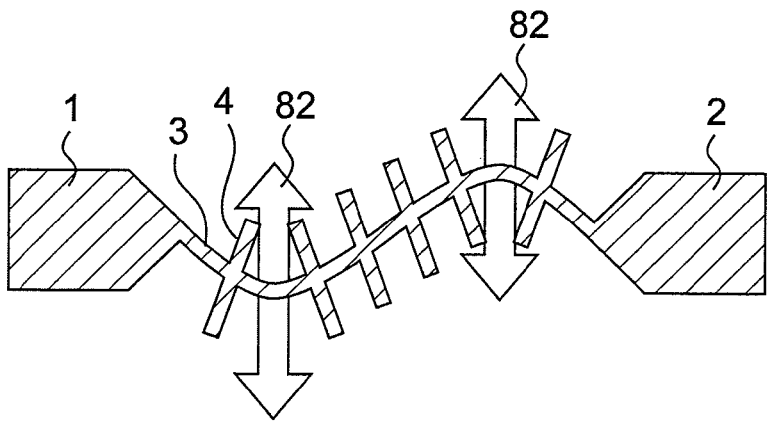
FIG. 10C is a plan view showing an oscillating state of the MEMS resonator in a secondary harmonic resonant frequency mode according to the present preferred embodiment.

FIG. 10C is a plan view showing an oscillating state of the MEMS resonator in a secondary harmonic resonant frequency mode according to the present preferred embodiment. This shows a case of turning on only the switch 66 of FIG. 5 to excite the main movable beam 3 using the two exciting electrodes 18 and 19 located to be away from each other by a predetermined distance and located at different sides on both sides of the main movable beam 3, respectively. In this case, the MEMS resonator oscillates in the secondary harmonic resonant frequency mode.

Figure 11:
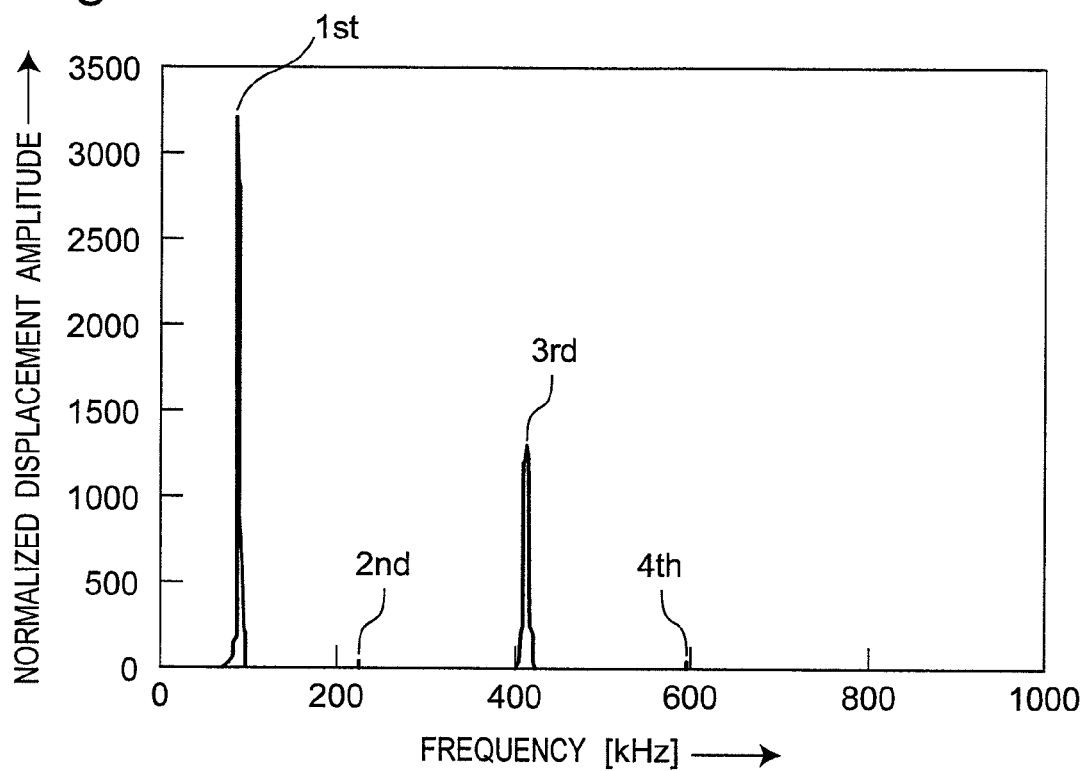
FIG. 11 is a graph showing spectrums of oscillation signals when only a switch 61 is turned on to excite only the exciting electrode 5 in the MEMS oscillator shown in FIG. 5.

FIG. 11 is a graph showing spectrums of oscillation signals when only the switch 61 is turned on in the MEMS oscillator of FIG. 5 to excite only the exciting electrode 5. As apparent from FIG. 11, an oscillation signal in the primary resonant frequency mode (fundamental resonant frequency mode) and an oscillation signal in the ternary harmonic resonant frequency mode can be obtained. In this case, the oscillation signal in the ternary harmonic resonant frequency mode has a relatively low amplitude and the MEMS oscillator is considered to oscillate by overtone of the primary resonant frequency mode (fundamental resonant frequency mode) in this oscillation mode.

Figure 12:
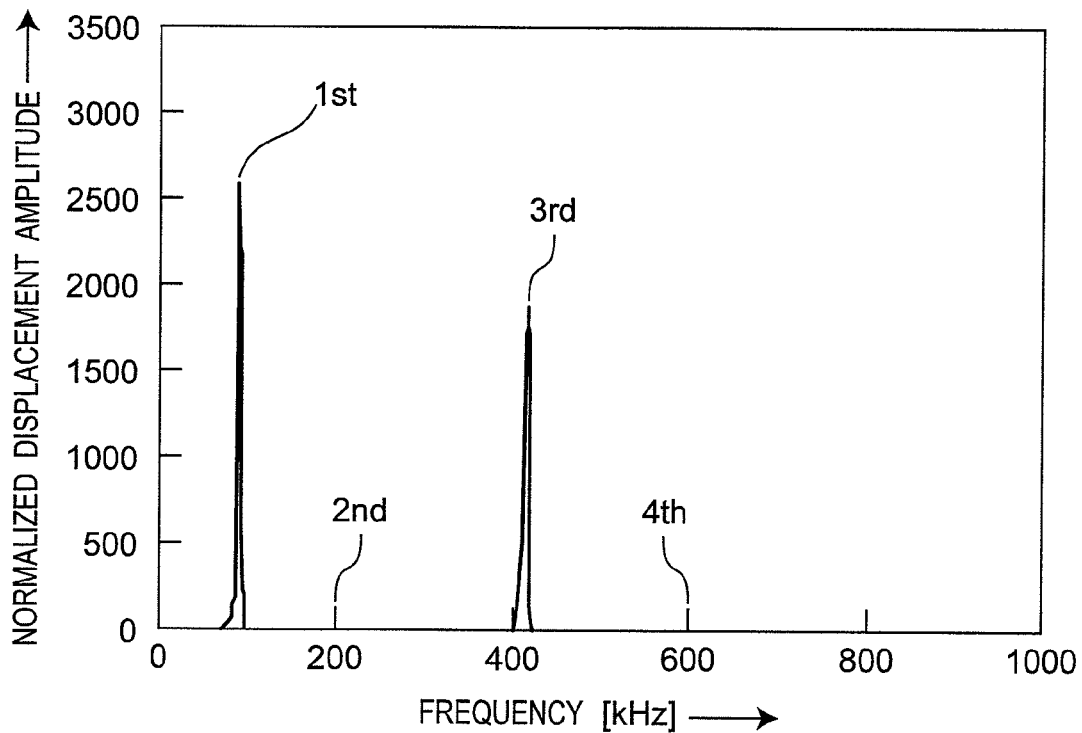
FIG. 12 is a graph showing spectrums of oscillation signals when only a switch 63 is turned on to excite only exciting electrodes 6 and 7 in the MEMS oscillator shown in FIG. 5.

FIG. 12 is a graph showing spectrums of oscillation signals when only the switch 63 is turned on in the MEMS oscillator of FIG. 5 to excite only the exciting electrodes 6 and 7. As apparent from FIG. 12, an oscillation signal in the primary resonant frequency mode (fundamental resonant frequency mode) and an oscillation signal in the ternary harmonic resonant frequency mode can be obtained. In this case, the oscillation signal in the ternary harmonic resonant frequency mode is higher in amplitude than that shown in FIG. 11. The MEMS oscillator is considered to oscillate not by overtone of the primary resonant frequency mode (fundamental resonant frequency mode) but by its own oscillation in this oscillation mode.

Figure 13:
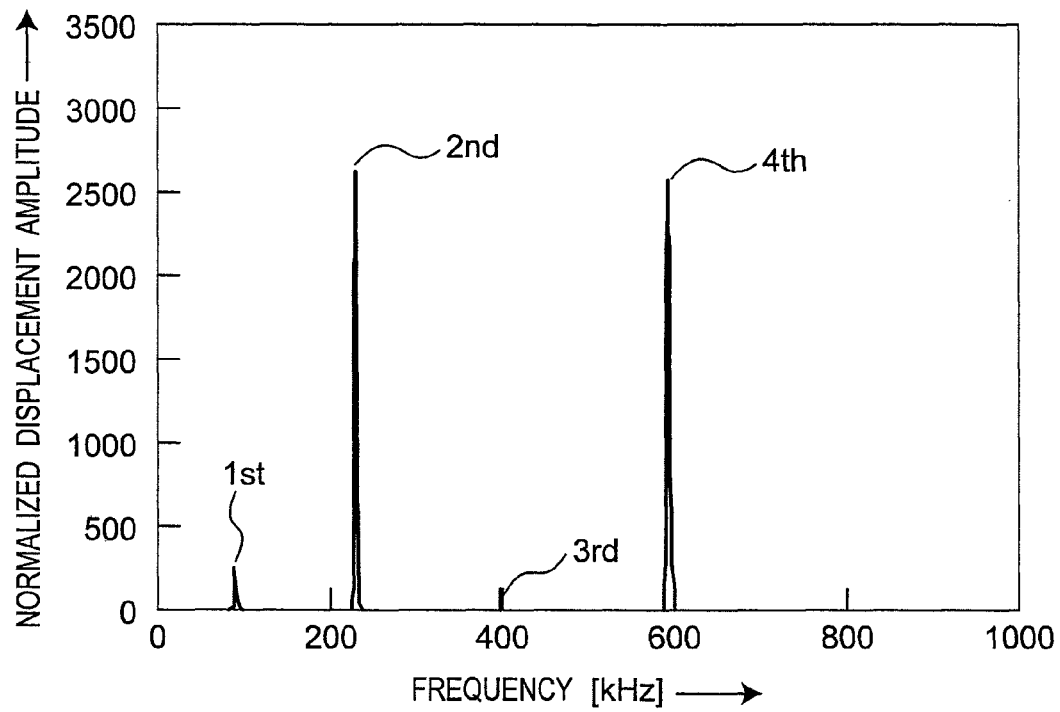
FIG. 13 is a graph showing spectrums of oscillation signals when only a switch 65 is turned on to excite only exciting electrodes 8 and 9 in the MEMS oscillator shown in FIG. 5.

FIG. 13 is a graph showing spectrums of oscillation signals when only the switch 65 is turned on in the MEMS oscillator of FIG. 5 to excite only the exciting electrodes 8 and 9. As apparent from FIG. 13, an oscillation signal in the secondary harmonic resonant frequency mode and an oscillation signal in a quadratic harmonic resonant frequency mode can be obtained. In these oscillation modes, both of the oscillation signals have relatively high oscillation amplitudes and the MEMS oscillator is considered to oscillate by its own oscillation.

Figure 14:
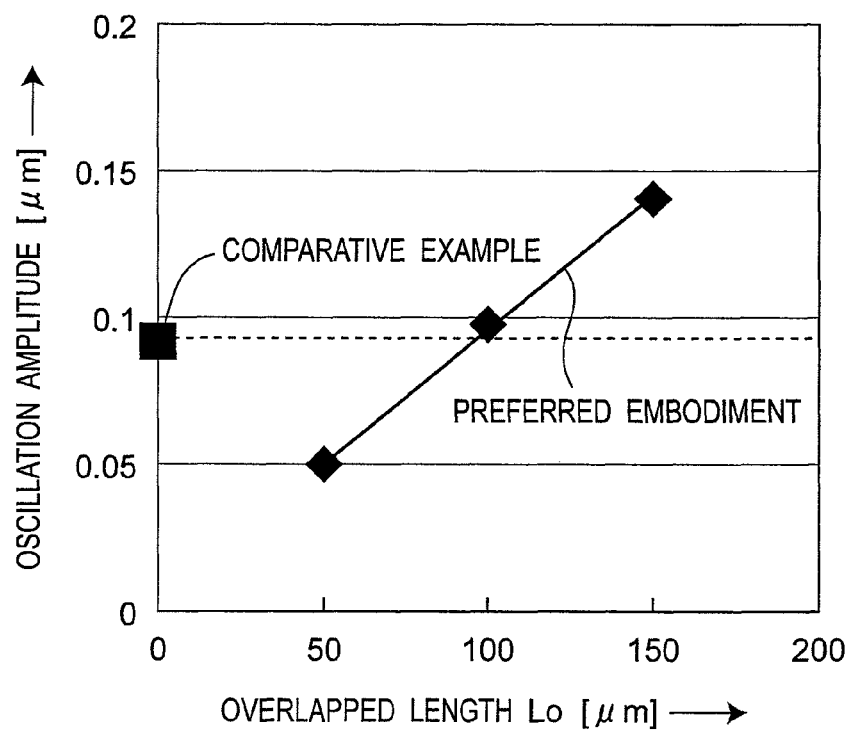
FIG. 14 is a graph showing a result of comparison between the comparative example shown in FIGS. 8A and 8B and the preferred embodiment shown in FIGS. 9A and 9B and showing an oscillation amplitude relative to an overlapped length Lo.

FIG. 14 is a graph showing a result of comparison between the comparative example shown in FIGS. 8A and 8B and the preferred embodiment shown in FIGS. 9A and 9B and showing an oscillation amplitude relative to the overlapped length Lo. As apparent from FIG. 14, by making large the overlapped length Lo, the MEMS resonator according to the present preferred embodiment shown in FIGS. 9A and 9B can obtain a high oscillation amplitude as compared with the MEMS resonator according to the comparative example including only the main movable beam 3.

As stated so far, according to the present preferred embodiment, the MEMS resonator can resonate not only with the fundamental resonant frequency but also with various harmonic resonance frequencies with changing the resonance frequencies by changing the number of the exciting electrodes 5 to 9 and 15 to 19 and arrangement positions thereof.

Furthermore, according to the prior arts, the electrostatic force generated from the electrode provided to be opposed to the oscillating beam directly acts on the oscillating beam as already stated. Accordingly, as the frequency is higher, the oscillating beam is made smaller in dimensions to reduce the area of the oscillating beam opposed to the exciting electrode. As a result, it is disadvantageously difficult to allow the electrostatic force to effectively act on the oscillating beam and the driving voltage disadvantageously increases. By comparison, according to the present preferred embodiment, the electrostatic force generated from the exciting electrode acts on the sub movable beams 4 and the electrostatic force is transmitted to the main movable beam 3 via the sub movable beams 4 as shown in FIG. 9B. The area of the sub movable beams 4 opposed to the exciting electrode can be made large even if the main movable beam 3 becomes short. This can advantageously increase degree of design freedom and considerably reduce the driving voltage.

Moreover, according to the present preferred embodiment, the resonator is produced with changing the length of each sub movable beam 4, the formation distance between the sub movable beams 4, and the number of the sub movable beams 4, whereby the MEMS resonator having many resonance frequencies can be realized. Further, by selecting the number and arrangement positions of the exciting electrodes, oscillation signals with desired resonance frequencies can be pulled out. By scanning the frequency of each exciting signal, the resonant frequency with which the MEMS resonator is in the resonant state (the MEMS resonator has the maximum amplitude) can be detected.

Furthermore, by selecting the number of arrangement positions of the exciting electrodes, a Q-value of one higher-order mode can be set selectively high. By changing combinations of positions of the exciting electrodes, a Q-value of the resonant frequency can be changed.

Modified Preferred Embodiment

Figure 15:
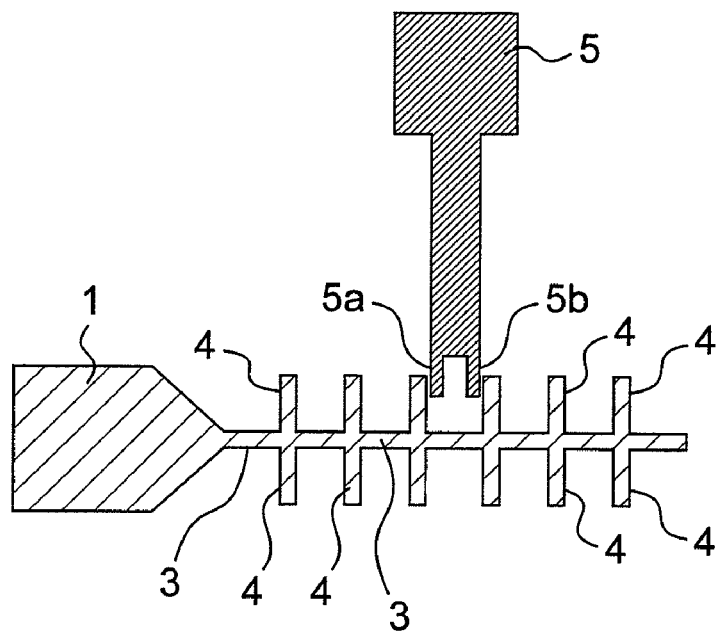
FIG. 15 is a plan view showing a MEMS resonator including a cantilever beam according to a modified preferred embodiment of the present invention.

FIG. 15 is a plan view showing a MEMS resonator including a cantilever beam according to a modified preferred embodiment of the present invention. In the above-stated preferred embodiment, the center impeller type beam having both ends fixed is formed. However, the present invention is not limited to this. As shown in FIG. 15, the beam may be formed into a cantilever beam shape fixed only to an anchor unit 1 on one side.

Figure 16:
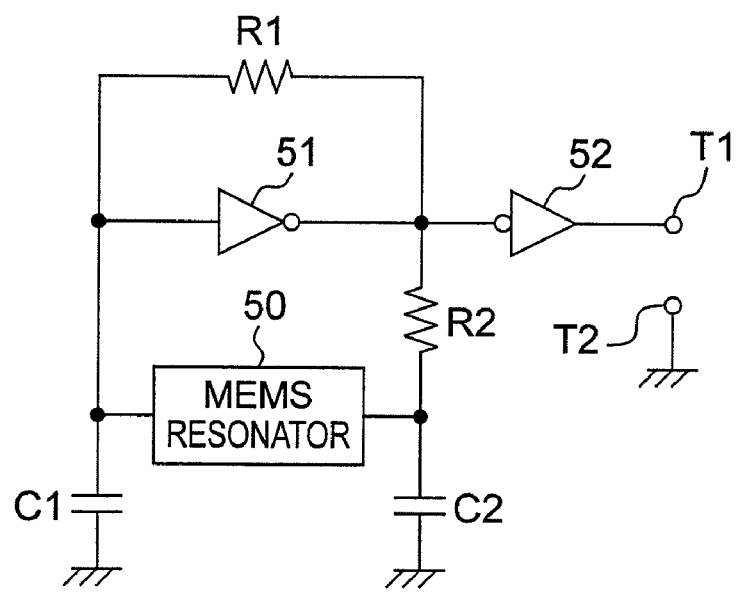
FIG. 16 is a circuit diagram showing a MEMS oscillator using the MEMS resonator according to the present preferred embodiment.

FIG. 16 is a circuit diagram showing a MEMS oscillator using the MEMS resonator according to the present preferred embodiment. The MEMS oscillator shown in FIG. 16 is a CMOS inverter oscillation circuit using a MEMS resonator 50. Referring to FIG. 16, one end of the MEMS resonator 50 is connected to an input terminal of an inverter 51 and grounded via a capacitor C1. Another end of the MEMS resonator 50 is connected to an output terminal of the inverter 51 via a resistor R2 and grounded via a capacitor C2. A feedback resistor R1 is connected between the input terminal and the output terminal of the inverter 51, and an oscillation signal outputted from the output terminal of the inverter 51 is outputted to output terminals T1 and T2 via an inverter 52. The CMOS inverter oscillation circuit is constituted using the MEMS resonator 50 configured as stated above and having a relatively high Q-value. Therefore, an oscillation signal having a resonant frequency or a stable oscillation frequency identical to a harmonic frequency of the resonant frequency can be generated directly with a relatively high frequency (e.g., 100 MHz to 1000 MHz) and the oscillation frequency can be changed as already stated above.

Figure 17:
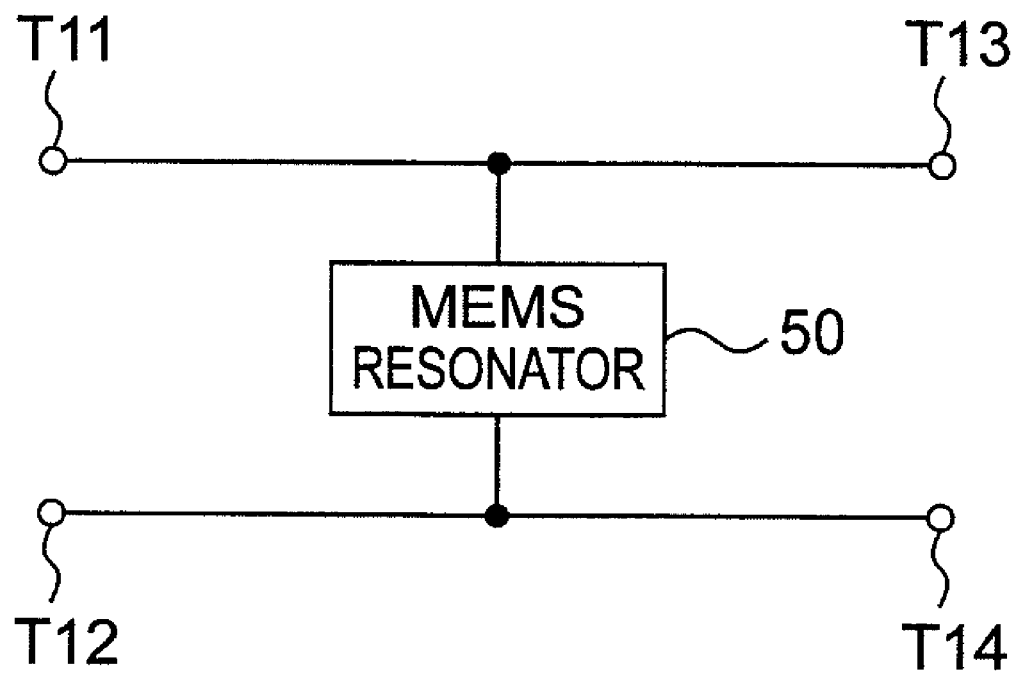
FIG. 17 is a circuit diagram showing a band-stop filter using the MEMS resonator according to the present preferred embodiment.
Figure 18:
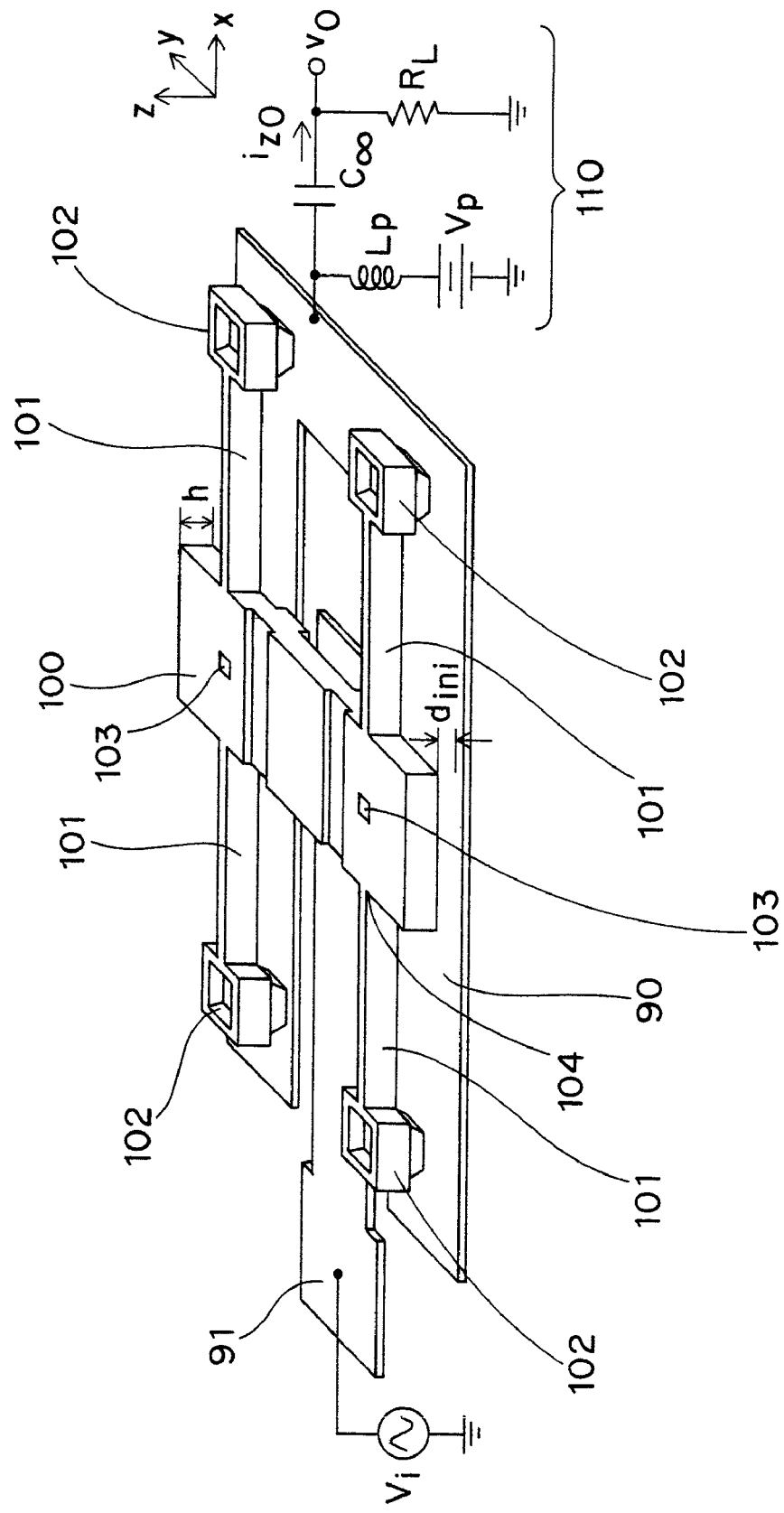
FIG. 18 is a perspective view showing a configuration of a free-free-beam MEMS resonator according to a prior art and a circuit diagram thereof.

FIG. 17 is a circuit diagram showing a band-stop filter using the MEMS resonator according to the present preferred embodiment. Referring to FIG. 17, a MEMS resonator 50 constituting a parallel LC resonance circuit is inserted between first terminals T11 and T12 and second terminals T13 and T14. Therefore, the band-stop filter can be constituted. The band-stop filter is constituted using the MEMS resonator 50 configured as stated above and having a relatively high Q-value. Therefore, a stopped band is narrow and stable. Besides, as stated above, a frequency of the stopped band can be changed. It is to be noted that the band-stop filter is an example of a MEMS device characterized by including a MEMS resonator and by using the resonant state of the MEMS resonator.

Implemental Example

Table 1 shows specifications of an example of the MEMS resonator produced by the inventor of the present invention as a prototype as follows.

TABLE 1

| Specifications of MEMS Resonator | |
|---|---|
| Dimensions | Resonant frequency |
| Length of main movable beam 3: 760 µm | First-order mode: 88 kHz |
| Length of each sub movable beam 4: 100 µm | Second-order mode: 230 kHz |
| Width of each of beams 3 and 4: 10 µm | Third-order mode: 412 kHz |
| Height of each of beams 3 and 4: 10 µm | Fourth-order mode: 591 kHz |
| Initial gap "g": 2 µm | |

As mentioned above in detail, the MEMS resonator of the present invention can resonate with at least one frequency of the fundamental wave and the harmonic waves without using the overtone technique, with changing resonance frequencies, and can be excited at a lower driving voltage than that according to the prior arts. Moreover, a very small frequency-variable oscillator using the MEMS resonator and a MEMS device using a resonant state of the MEMS resonator can be constituted. The MEM resonator, the MEMS oscillation circuit, the MEMS device according to the present invention can be useful as RF-MEMS devices for use in mobile telephones, and wireless LAN systems.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:
1. A Micro-Electro-Mechanical System (MEMS) resonator, comprising:
    a main movable beam having first and second ends, the main movable beam being electrically insulated from a substrate and fixed to at least one end of the first and second ends;
    a plurality of sub movable beams including first, second, third and fourth sub movable beams, the sub movable beams being formed at respective predetermined intervals in a direction substantially perpendicular to a longitudinal direction of the main movable beam, to extend from the main movable beam and to project from both of first and second side surfaces of the main movable beam;
    a first exciting electrode provided at a position of the first side surface of the main movable beam to be close to the first and second sub movable beams which are located at a center of the longitudinal direction of the main movable beam;

a second exciting electrode provided at a position of the first side surface of the main movable beam to be close to the second sub movable beam and the third sub movable beam which is located to be adjacent at a side of the first end to the second sub movable beam; and a third exciting electrode provided at a position of the second side surface of the main movable beam to be close to the first sub movable beam and the fourth sub movable beam which is located to be adjacent at a side of the second end to the first sub moveable beam, wherein the first and second sub movable beams are excited by an electrostatic force to oscillate in an oscillation direction substantially perpendicular to the longitudinal direction of the main movable beam and parallel to a surface of the substrate by exciting the first exciting electrode using an alternating-current signal, such that the MEMS resonator resonates with a resonant frequency of a first-order mode thereof, and the first to fourth sub movable beams are excited by an electrostatic force to oscillate in the oscillation direction by exciting the second and third exciting electrodes using the alternating-current signal, such that the MEMS resonator resonates with a resonant frequency of a second-order mode thereof.

2. The MEMS resonator of claim 1, wherein the first exciting electrode is connected via a first switch with an exciting signal generator for generating the alternating current signal, the second and third exciting electrodes are connected via a second switch with the exciting signal generator, and the MEMS resonator resonates with one of the resonant frequency of the first-order mode and the resonant frequency of the second-order mode by turning on one of the first and second switches, respectively.

3. The MEMS resonator of claim 2, wherein the plurality of sub movable beams further includes fifth and sixth sub movable beams, and the MEMS resonator further comprises:

a fourth exciting electrode provided at a position of the second side surface of the main movable beam to be close to the third sub movable beam and the fifth sub movable beam which is located to be adjacent at the side of the first end to the third sub movable beam; and a fifth exciting electrode provided at a position of the second side surface of the main movable beam to be close to the fourth sub movable beam and the six sub movable beam which is located to be adjacent at the side of the second end to the fourth sub movable beam, and wherein the third to sixth sub movable beams are excited by an electrostatic force to oscillate in the oscillation direction by exciting the fourth and fifth exciting electrodes using the alternating-current signal, such that the MEMS resonator resonates with a resonant frequency of a third-order mode thereof.

4. The MEMS resonator of claim 3, wherein the fourth and fifth exciting electrodes are connected via a third switch with the exciting signal generator, and the MEMS resonator resonates with one of the resonant frequency of the third-order mode by turning on the third switch.

5. The MEMs resonator of claim 1, wherein the plurality of sub movable beams further includes fifth and sixth sub movable beams, and the MEMS resonator further comprises:

a fourth exciting electrode provided at a position of the second side surface of the main movable beam to be close to the third sub movable beam and the fifth sub movable beam which is located to be adjacent at the side of the first end to the third sub movable beam; and a fifth exciting electrode provided at a position of the second side surface of the main movable beam to be close to the fourth sub movable beam and the sixth sub movable beam which is located to be adjacent at the side of the second end to the fourth sub movable beam, and wherein the third to sixth sub movable beams are excited by an electrostatic force to oscillate in the oscillation direction by exciting the fourth and fifth exciting electrodes using the alternating-current signal, such that the MEMS resonator resonates with a resonant frequency of a third-order mode thereof.

6. The MEMS resonator of claim 5, wherein the fourth and fifth exciting electrodes are connected via a third switch with the exciting signal generator, and the MEMS resonator resonates with the resonate frequency of a third-order mode by turning on the third switch.

7. The MEMS resonator of claim 5, wherein the main movable beam is fixed at the first and second ends thereof.

8. The MEMS resonator of claim 5, wherein the substrate is one of a dielectric substrate and a semiconductor substrate, and each of the main movable beam and the sub movable beams is made of one of an electric conductive material and a semiconductor material.

9. The MEMS resonator of claim 1, wherein the main movable beam is fixed at the first and second ends thereof.

10. The MEMS resonator of claim 1, wherein the substrate is one of a dielectric substrate and a semiconductor substrate, and each of the main movable beam and the sub movable beams is made of one of an electric conductive material and a semiconductor material.

11. A Micro-Electro-Mechanical System (MEMS) resonator, comprising:

a main movable beam having first and second ends, the main movable beam being electrically insulated from a substrate and fixed to at least one end of the first and second ends;

a plurality of sub movable beams including first, second, third, fourth, fifth and sixth sub movable beams, the sub movable beams being formed at respective predetermined intervals in a direction substantially perpendicular to a longitudinal direction of the main movable beam, to extend from the main movable beam and to project from both of first and second side surfaces of the main movable beam;

a first exciting electrode provided at a position of the first side surface of the main movable beam to be close to the first and second sub movable beams which are located at a center of the longitudinal direction of the main movable beam;

a fourth exciting electrode provided at a position of the second side surface of the main movable beam to be close to the third sub movable beam which is located to be adjacent at a side of the first end to the second sub movable beam, and to be close to the fifth sub movable beam which is located to be adjacent at the side of the first end to the third sub movable beam; and a fifth exciting electrode provided at a position of the second side surface of the main movable beam to be close to the fourth sub movable mean which is located to be adjacent at a side of the second end to the first sub movable beam, and to be close to the sixth sub movable beam which is located to be adjacent at the side of the second end to the fourth sub movable beam, wherein the first and second sub movable beams are excited by an electrostatic force to oscillate in an oscillation direction substantially perpendicular to the longitudinal direction of the main movable beam and parallel to a surface of the substrate by exciting the first exciting electrode using an alternating-current signal, such that the MEMS resonator resonates with a resonant frequency of a first-order mode thereof, and the third to sixth sub movable beams are excited by an electrostatic force to oscillate in the oscillation direction by exciting the fourth and fifth exciting electrodes using the alternating-current signal, such that the MEMS resonator resonates with a resonant frequency of a third-order mode thereof.

12. The MEMS resonator of claimed 11, wherein the first exciting electrode is connected via a first switch with an exciting signal generator for generating the alternating-current signal, the fourth and fifth exciting electrodes are connected via a third switch with the exciting signal generator, and the MEMS resonator resonates with one of the resonant frequency of the first-order mode and the resonant frequency of the third-order mode by turning on one of the first and third switches, respectively.

13. The MEMS resonator of claim 11, wherein the main movable beam is fixed at the first and second ends thereof.

14. The MEMS resonator of claim 11, wherein the substrate is one of a dielectric substrate and a semiconductor substrate, and each of the main movable beam and the sub movable beams is made of one of an electric conductive material and a semiconductor material.

15. A Micro-Electro-Mechanical System (MEMS) oscillation circuit including a MEMS resonator, wherein the MEMS resonator comprises:

a main movable beam having first and second ends, the main movable beam electrically insulated from a substrate and fixed to at least one end of the first and second ends;

a plurality of sub movable beams including first, second, third and fourth sub movable beams, the sub movable beams formed at respective predetermined intervals in a direction substantially perpendicular to a longitudinal direction of the main movable beam, to extend from the main movable beam and to project from both of first and second side surfaces of the main movable beam;

a first exciting electrode provided at a position of the first side surface of the main movable beam to be close to the first and second sub movable beams which are located at a center of the longitudinal direction of the main movable beam;

a second exciting electrode provided at a position of the first side surface of the main movable beam to be close to the second sub movable beam and the third sub movable beam which is located to be adjacent at a side of the first end to the second sub movable beam; and a third exciting electrode provided at a position of the second side surface of the main movable beam to be close to the first sub movable beam and the fourth sub movable beam which is located to be adjacent at a side of the second end to the first sub movable beam, wherein the first and second sub movable beams are excited by an electrostatic force to oscillate in an oscillation direction substantially perpendicular to the longitudinal direction of the main movable beam and parallel to a surface of the substrate by exciting the first exciting electrode using an alternating-current signal, such that the MEMS resonator resonates with a resonant frequency of a second-order mode thereof, the first to fourth sub movable beams are excited by an electrostatic force to oscillate in the oscillation direction by exciting the second and third exciting electrodes using the alternating-current signal, such that the MEMS resonator resonates with a resonant frequency of a second-order mode thereof, and the MEMS oscillation circuit oscillates with an identical frequency to the resonant frequency of the MEMS resonator.

16. The MEMS oscillation circuit of claim 15, wherein the plurality of sub movable beams further includes fifth and sixth sub movable beams, and the MEMS resonator further comprises:

a fourth exciting electrode provided at a position of the second side surface of the main movable beam to be close to the third sub movable beam and the fifth sub movable beam which is located to be adjacent at the side of the first end to the third sub movable beam; and a fifth exciting electrode provided at a position of the second side surface of the main movable beam to be close to the fourth sub movable beam and the sixth sub movable beam which is located to be adjacent at the side of the second end to the fourth sub movable beam, and wherein the third to sixth sub movable beams are excited by an electrostatic force to oscillate in the oscillation direction by exciting the fourth and fifth exciting electrodes using the alternating current signal, such that the MEMS resonator resonates with a resonant frequency of a third-order mode thereof.

17. A Micro-Electro-Mechanical System (MEMS) oscillation circuit including a MEMS resonator, wherein the MEMS resonator comprises:

a main movable beam having first and second ends, the main movable beam being electrically insulated from a substrate and fixed to at least one end of the first and second ends;

a plurality of sub movable beams including first, second, third, fourth, fifth and sixth sub movable beams, the sub movable beams being formed at respective predetermined intervals in a direction substantially perpendicular to a longitudinal direction of the main movable beam, to extend from the main movable beam and to project from both first and second side surfaces of the main movable beam;

a first exciting electrode provided at a position of the first side surface of the main movable beam to be close to the first and second sub movable beams which are located at a center of the longitudinal direction of the main movable beams;

a fourth exciting electrode provided at a position of the second side surface of the main movable beam to be close to the third sub movable beam which is located to be adjacent at a side of the first end to the second sub movable beam, and to be close to the fifth sub movable beam which is located to be adjacent at the side of the first end to the third sub movable beam; and a fifth exciting electrode provided at a position of the second side surface of the main movable beam to be close to the fourth sub movable beam which is located to be adjacent at a side of the second end to the first sub movable beam, and to be close to the sixth sub movable beam which is located to be adjacent at the side of the second end to the fourth sub movable beam, wherein the first and second sub movable beams are excited by an electrostatic force to oscillate in an oscillation direction substantially perpendicular to the longitudinal direction of the main movable beam and parallel to a surface of the substrate by exciting the first exciting electrode using an alternating-current signal, such that the MEMS resonator resonates with a resonant frequency of a first-order mode thereof, the third to sixth sub movable beams are excited by an electrostatic force to oscillate in the oscillation direction by exciting the fourth and fifth exciting electrodes using the alternating-current signal, such that the MEMS resonator resonates with a resonant frequency of a third-order mode thereof, and the MEMS oscillation circuit oscillates with an identical frequency to the resonant frequency of the MEMS resonator.

18. A Micro-Electro-Mechanical System (MEMS) device including a MEMS resonator, wherein the MEMS resonator comprises:

a main movable beam having first and second ends, the main movable being beam electrically insulated from a substrate and fixed to at least one end of the first and second ends;

a plurality of sub movable beams including first, second, third and fourth sub movable beams, the sub movable beams being formed at respective predetermined intervals in a direction substantially perpendicular to a longitudinal direction of the main movable beam, to extend from the main movable beam and to project from both first and second side surfaces of the main movable beam;

a first exciting electrode provided at a position of the first side surface of the main movable beam to be close to the first and second sub movable beams which are located at a center of the longitudinal direction of the main movable beams;

a second exciting electrode provided at a position of the first side surface of the main movable beam to be close to the second sub movable beam and the third sub movable beam which is located to be adjacent at a side of the first end to the second sub movable beam; and a third exciting electrode provided at a position of the second side surface of the main movable beam to be close to the first sub movable beam and the fourth sub movable beam which is located to be adjacent at a side of the second end to the first sub movable beam, wherein the first and second sub movable beams are excited by an electrostatic force to oscillate in an oscillation direction substantially perpendicular to the longitudinal direction of the main movable beam and parallel to the surface of the substrate by exciting the first exciting electrode using an alternating-current signal, such that the MEMS resonator resonates with a resonant frequency of a first-order mode thereof, the first to fourth sub movable beams are excited by an electrostatic force to oscillate in the oscillation direction by exciting the second and third exciting electrodes using the alternating-current signal, such that the MEMS resonator resonates with a resonant frequency of a second-order mode thereof, and the MEMS oscillation circuit oscillates with an identical frequency to the resonant frequency of the MEMS resonator.

19. The MEMS device of claim 18, wherein the plurality of sub movable beams further includes fifth and sixth sub movable beams, and the MEMS resonate further comprises:

a fourth exciting electrode provided at a position of the second side surface of the main movable beam to be close to the third sub movable beam and the fifth sub movable beam which is located to be adjacent at the side of the first end to the third sub movable beam; and a fifth exciting electrode provided at a position of the second side surface of the main movable beam to be close to the fourth sub movable beam and the sixth sub movable beam which is located to adjacent at the side of the second end to the fourth sub movable beam, and wherein the third to sixth sub movable beams are excited by an electrostatic force to oscillate in the oscillation direction by exciting the fourth and fifth exiting electrodes using the alternating-current signal, such that the MEMS resonator resonates with a resonant frequency of a third-order mode thereof.

20. A Micro-Electro-Mechanical System (MEMS) device including a MEMS resonator, wherein the MEMS resonator comprises:

a main movable beam having first and second ends, the main movable beam being electrically insulated from a substrate and fixed to at least one end of the first and second ends;

a plurality of sub movable beams including first, second, third, fourth, fifth and sixth sub movable beams, the sub movable beams being formed at respective predetermined intervals in a direction substantially perpendicular to a longitudinal direction of the main movable beam, to extend from the main movable beam and to project from both first and second side surfaces of the main movable beam;

a first exciting electrode provided at a position of the first side surface of the main movable beam to be close to the first and second sub movable beams which are located at a center of the longitudinal direction of the main movable beams;

a fourth exciting electrode provided at a position of the second side surface of the main movable beam to be close to the third sub movable beam which is located to be adjacent at a side of the first end to the second sub movable beam, and to be close to the fifth sub movable beam which is located to be adjacent at the side of the first end to the third sub movable beam; and a fifth exciting electrode provided at a position of the second side surface of the main movable beam to be close to the fourth sub movable beam which is located to be adjacent at a side of the second end to the first sub movable beam, and to be close to the sixth sub movable beam which is located to be adjacent at the side of the second end to the fourth sub moveable beam, wherein the first and second sub movable beams are excited by an electrostatic force to oscillate in an oscillation direction substantially perpendicular to the longitudinal direction of the main movable beam and parallel to the surface of the substrate by exciting the first exciting electrode using an alternating-current signal, such that the MEMS resonator resonates with a resonant frequency of a first-order mode thereof, the third to sixth sub movable beams are excited by an electrostatic force to oscillate in the oscillation direction by exciting the fourth and fifth exiting electrodes using the alternating-current signal, such that the MEMS resonator resonates with a resonant frequency of a third-order mode thereof, and the MEMS device utilizes a resonant state of the MEMS resonator.

* * * * *